United States Patent
Tazawa et al.

(10) Patent No.: US 9,787,059 B2
(45) Date of Patent: Oct. 10, 2017

(54) SEMICONDUCTOR LIGHT EMITTING ELEMENT

(71) Applicant: STANLEY ELECTRIC CO., LTD., Meguro-ku, Tokyo (JP)

(72) Inventors: Komei Tazawa, Kawasaki (JP); Ji-Hao Liang, Tachikawa (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/294,409

(22) Filed: Oct. 14, 2016

(65) Prior Publication Data

US 2017/0110851 A1    Apr. 20, 2017

(30) Foreign Application Priority Data

Oct. 20, 2015  (JP) ................. 2015-206550

(51) Int. Cl.
| | |
|---|---|
| *H01S 5/22* | (2006.01) |
| *H01S 5/02* | (2006.01) |
| *H01S 5/042* | (2006.01) |
| *H01S 5/24* | (2006.01) |
| *H01S 5/20* | (2006.01) |
| H01S 5/028 | (2006.01) |
| H01S 5/16 | (2006.01) |
| H01S 5/323 | (2006.01) |

(52) U.S. Cl.
CPC .......... *H01S 5/2203* (2013.01); *H01S 5/0202* (2013.01); *H01S 5/0425* (2013.01); *H01S 5/2031* (2013.01); *H01S 5/22* (2013.01); *H01S 5/24* (2013.01); H01S 5/028 (2013.01); H01S 5/16 (2013.01); H01S 5/32341 (2013.01)

(58) Field of Classification Search
CPC ........ H01S 5/2203; H01S 5/0202; H01S 5/24; H01S 5/0425; H01S 5/2031; H01S 5/22; H01S 5/028; H01S 5/32341; H01S 5/16
See application file for complete search history.

(56) References Cited

U.S. PATENT DOCUMENTS

| | | | |
|---|---|---|---|
| 6,430,203 B1 * | 8/2002 | Yokouchi | H01S 5/20 |
| | | | 372/45.01 |
| 2008/0273563 A1 * | 11/2008 | Schmidt | H01S 5/16 |
| | | | 372/45.01 |

(Continued)

FOREIGN PATENT DOCUMENTS

| | | |
|---|---|---|
| JP | 2000133877 A | 5/2000 |
| JP | 2001054677 A | 2/2001 |

*Primary Examiner* — Xinning Niu
(74) *Attorney, Agent, or Firm* — Holtz, Holtz & Volek PC (57) ABSTRACT

A semiconductor light-emitting element includes a multi-layer body including a first end surface and a second end surface which are opposed to each other, wherein a first semiconductor layer, a light emitting layer, and a second semiconductor layer are stacked; a pair of recesses that are formed on the second semiconductor layer, separated from the second end surface, and separated from each other in the direction parallel to the first and second end surfaces; a ridge portion that is a protrusion between the pair of recesses and extends along the direction perpendicular to the first and second end surfaces; a band-shaped electrode disposed on the ridge portion; and a light guide layer formed on the second semiconductor layer between the ridge portion and the second end surface and guides light from the light emitting layer.

17 Claims, 11 Drawing Sheets

(56) References Cited

U.S. PATENT DOCUMENTS

2011/0058586 A1* 3/2011 Takizawa .............. B82Y 20/00
372/45.01
2011/0121337 A1* 5/2011 Shakuda ............ H01S 5/32341
257/98

* cited by examiner

SEMICONDUCTOR LIGHT EMITTING ELEMENT

BACKGROUND OF THE INVENTION

1. Field of the Invention

The present invention relates to a semiconductor light emitting element, and in particular to a Laser Diode (LD) element.

2. Description of the Related Art

A semiconductor laser element with a ridge structure which is a current constriction structure intended for controlling the transverse mode of a laser beam has been conventionally used. A semiconductor laser of a ridge structure uses, as a resonator, its two end surfaces cleaved in the direction orthogonal to the longitudinal direction of the ridge. Patent Document 1 (Japanese Patent Application Laid-Open No. 2000-133877) discloses a semiconductor laser element wherein the width of the ridge structure near the end surface is wider than that of the central portion. Patent Document 2 (Japanese Patent Application Laid-Open No. 2001-54677) discloses a semiconductor light-emitting element in which a ridge portion is not disposed on the end surface side, or the width of the ridge portion is wider than that of the central portion and the width of an electrode disposed on the ridge is narrower on the end surface side than that at the central portion.

SUMMARY OF THE INVENTION

To form a semiconductor laser element of a ridge structure by cleaving, a crack is likely to occur on a cleaved surface when the ridge extends to the end surface. Occurrence of a crack causes performance deterioration, such as an increase in the threshold current or degradation of laser output characteristics over time.

As in Patent Document 1, for example, to prevent a crack from occurring, the ridge width is wide near the end surface. In this configuration, while the likelihood of crack occurrence decreases, the light confinement efficiency decreases (waveguide loss). As a gain is needed to compensate for this type of waveguide loss, the threshold current and the power consumption are increased.

The present invention has been made in view of the foregoing. An object of the present invention is to provide a highly reliable semiconductor light-emitting element with excellent transverse mode controllability and light emitting characteristics.

According to the present invention, there is provided a semiconductor light-emitting element which includes a semiconductor multilayer body including a first end surface and a second end surface which are opposed to each other, wherein a first semiconductor layer, a light emitting layer, and a second semiconductor layer which is an opposite conductivity-type to that of the first semiconductor layer are stacked, in this order, on a substrate; a pair of recesses that are formed on the second semiconductor layer, separated from the second end surface, and separated from each other in a direction parallel to the first end surface and the second end surface; a ridge portion that is a protrusion between the pair of recesses and extends along a direction perpendicular to the first end surface and the second end surface; a band-shaped electrode disposed on the ridge portion; and a light guide layer that is formed on the second semiconductor layer between the ridge portion and the second end surface and guides radiation light from the light emitting layer.

DETAILED DESCRIPTION OF THE INVENTION

Preferred embodiments of the present invention will be hereinbelow described in detail. In the description below and the attached drawings, the same reference sign is assigned to substantially identical elements or equivalent elements.

First Embodiment

Figure 1A:
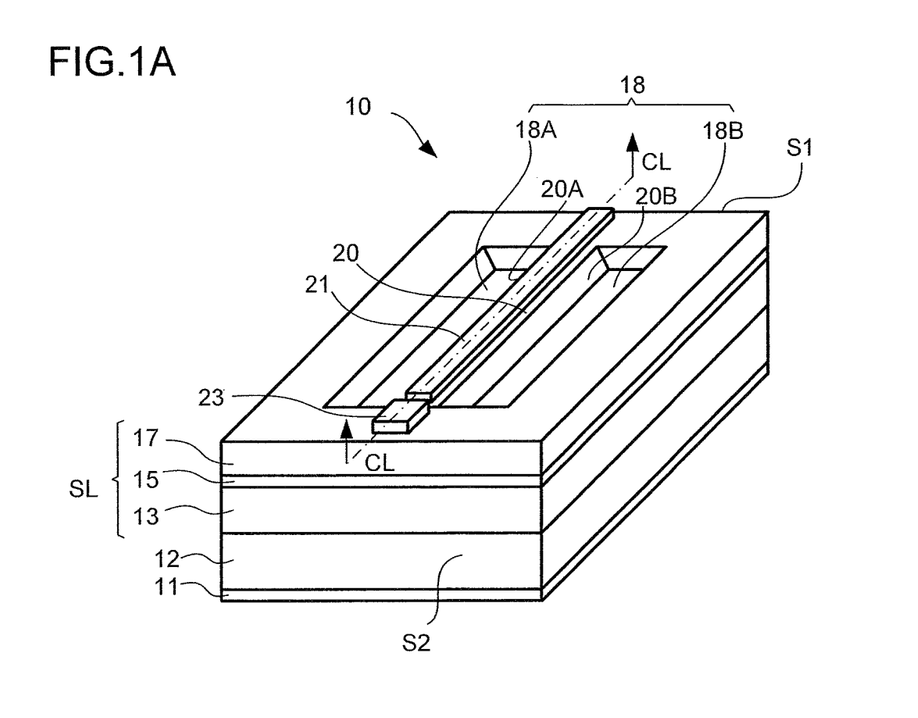
FIG. 1A is a perspective view schematically illustrating a semiconductor light-emitting element according to a first embodiment.
Figure 1B:
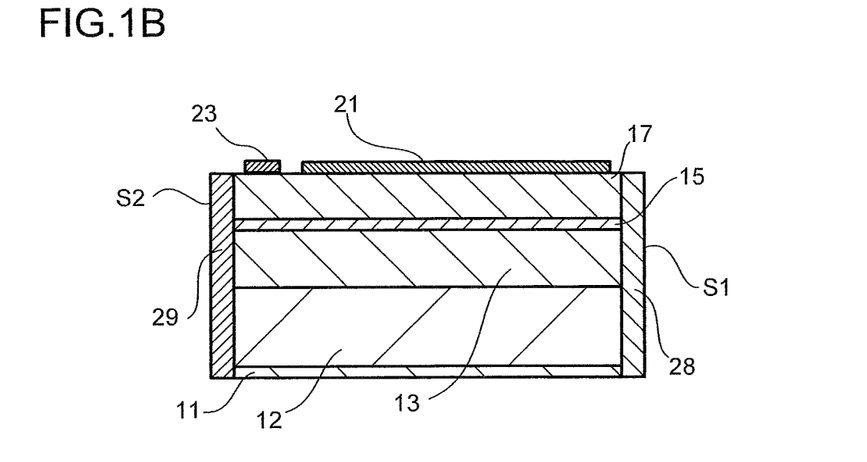
FIG. 1B is a cross-sectional view taken along a CL-CL line of FIG. 1A.
Figure 2:
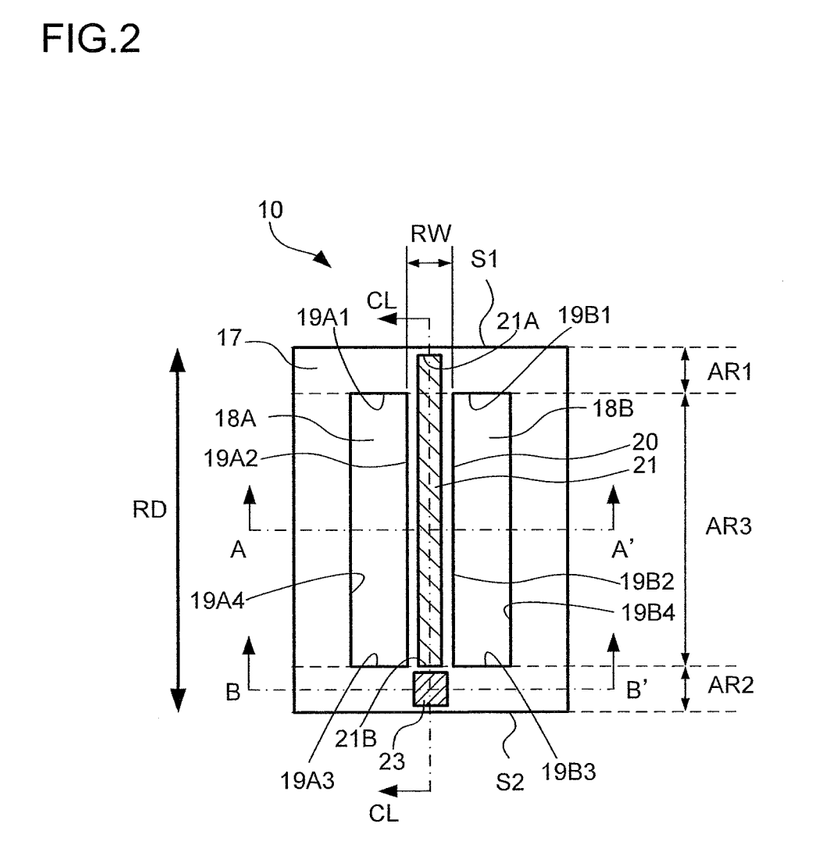
FIG. 2 is a top view schematically illustrating the semiconductor light-emitting element according to the first embodiment.

FIG. 1A is a perspective view schematically illustrating a semiconductor light-emitting element 10 according to a first embodiment. FIG. 1B is a cross-sectional view taken along a CL-CL line of FIG. 1A. FIG. 2 is a top view of the semiconductor light-emitting element 10. Hereinafter, the semiconductor light-emitting element 10 will be described with reference to FIGS. 1A, 1B and 2. For the sake of clarity, hatching is made on certain constituent elements in the top view of FIG. 2.

The semiconductor light-emitting element 10 includes: a first electrode 11; a substrate 12; a semiconductor multilayer body (hereinafter also simply referred to as "multilayer body") SL where an n-type semiconductor layer serving as a first semiconductor layer of a first conductivity type, a light emitting layer 15, and a p-type semiconductor layer 17 serving as a second semiconductor layer of a second conductivity type are laminated or stacked in this order on a substrate 12; and a second electrode 21. The semiconductor layers constituting the multilayer body SL have a composition of, for example, a GaN-based semiconductor, such as GaN, InGaN, or AlGaN. A semiconductor of another composition, such as a GaAs-based semiconductor and an InP-based semiconductor, may also be used.

The semiconductor light-emitting element 10 includes a surface (or a first edge surface) S1 and a second end surface (or a second edge surface) S2, which are opposed to each other. This embodiment has been described by referring to the configuration where the semiconductor light emitting-element 10 has a resonator or cavity structure of a Fabry-Pérot (FP) type. Specifically, the first end surface S1 and the second end surface S2 constitute a resonator.

The second end surface S2 has a higher reflectance than that of the first end surface S1 with respect to radiation light from the light emitting layer 15. The first end surface S1 and the second end surface S2 each have a reflective film whose reflectance is higher than that of a cleaved surface (see FIG. 1B). FIG. 1B schematically illustrates the reflective films 28, 29. However, the reflective films 28, 29 are omitted in the other drawings relating to the embodiment for the sake of clarity.

A pair of recesses 18, which are a recess 18A and a recess 18B, are disposed on the surface of the p-type semiconductor layer of the semiconductor light-emitting element 10. The pair of recesses 18 are each separated or spaced from the first end surface S1 and the second end surface S2 at a distance and are separated from each other in a direction parallel to the first end surface S1 and the second end surface S2. The recess 18A and the recess 183 are formed as a pair of recesses recessed from the surface of the p-type semiconductor layer 17. More specifically, the recess 18A and the recess 18B each have a rectangular opening and a bottom surface and have a shape of reverse truncated pyramid where the area of the opening is larger than that of the bottom surface.

The recess 18A and the recess 18B have the same shape and dimensions and are disposed so as to be aligned in the direction perpendicular to the first end surface S1 and the second end surface S2. The recess 18A and the recess 18B are separated from each other in a direction parallel to the first end surface S1 and the second end surface S2. The area (i.e., protrusion) between the recess 18A and the recess 18B is a ridge portion 20.

Accordingly, the ridge portion 20 extends along the direction (i.e., resonance direction RD) perpendicular to the first end surface S1 and the second end surface S2. The widths of the top and bottom sections of the ridge portion 20 are substantially constant in the extending direction. The width of the ridge portion 20 decreases in the direction from the bottom section to the top section (or the height direction of the ridge portion 20), which means that the ridge portion 20 has a so-called forward mesa shape. The ridge portion 20 has a cross-sectional shape (i.e., isosceles trapezoidal shape) that is symmetrical about a center line CL parallel to the resonance direction RD.

More specifically, sides 19A1 and 19B1 of rectangular openings of the recess 18A and the recess 18B, respectively, are formed on the surface of the p-type semiconductor layer 17. The sides 19A1 and 19B1 are parallel to the first end surface S1 and are on the same straight line. Hereinafter, a first area AR1 refers to the area of the p-type semiconductor layer 17 between the straight line through the sides 19A1 and 19B1 and the first end surface S1.

Sides 19A3 and 19B3 of the openings of the recess 18A and the recess 18B, which are opposite to the sides 19A1 and 19B1, respectively, are parallel to the second end surface S2 and are on the same straight line. Hereinafter, a second area AR2 refers to the area of the p-type semiconductor layer 17 between the straight line through the sides 19A3 and 19B3 and the second end surface S2. A third area AR3 refers to the area of the p-type semiconductor layer 17 between the straight line through the sides 19A1 and 19B1 and the straight line through the sides 19A3 and 19B3, the area including the recess 18A and the recess 18B.

Sides of the recess 18A that are formed on the p-type semiconductor layer 17 and are orthogonal to the sides 19A1 and 19A3 are denoted by 19A2 and 19B4, respectively, in FIG. 2. The side 19A2 is the side of the top section of the ridge portion 20 and is opposite to the side 19A4. Likewise, sides of the recess 18B that are formed on the p-type semiconductor layer 17 and are orthogonal to the sides 19B1 and 19B3 are denoted by 19B2 and 19B4, respectively. The side 19B2 is the side of the top section of the ridge portion 20 and is opposite to the side 19B4. The side 19A2 and the side 19B2 are sides that define side walls 20A and 20B of the ridge portion 20 (see FIG. 1A and FIG. 3A).

As described above, the recess 18A and the recess 185 are disposed so as to be aligned in the direction (i.e., resonance direction RD) perpendicular to the first end surface S1 and the second end surface S2. The side 19A2 of the recess 18A and the side 19B2 of the recess 18B, in other words, the side wall 20A of the recess 18A and the side wall 20B of the recess 18B, are disposed at an identical position in the perpendicular direction. Here, the ridge portion 20 is formed by the recess 18A and the recess 18B. In the third area AR3, the recesses 18A and 18B each may extend in the direction perpendicular to the resonance direction RD so as to reach the side surface of the multilayer body SL.

On the ridge portion 20, a band-shaped electrode 21 is formed as a second electrode (p-electrode) in a band shape along the ridge portion 20. As illustrated in FIG. 2, hatching is made on the area where the band-shaped electrode 21 is formed. The band-shaped electrode 21 is formed of, for example, a metal. One end portion 21A of the band-shaped electrode 21 extends to the first area AR1. It is preferable that the end portion 21A extend to the first end surface S1. Another end portion 21B of the band-shaped electrode 21 is separated or spaced from the second end surface S2 at a distance and does not extend to the second area AR2.

The second area AR2 is provided with a light guide layer 23. As illustrated in FIG. 2, hatching is made on the area where the light guide layer 23 is formed. The light guide layer 23 is formed so as to be aligned along the center line CL of the ridge portion 20. According to this embodiment, the width of the light guide layer 23 (i.e., width in the direction perpendicular to the resonance direction RD) is smaller than or equal to the width RW of the top section of the ridge portion 20. The light guide layer 23 is formed of a transparent or light-transmitting dielectric film for the emitted light, for example, $SiO_2$, $Al_2O_3$, $Ta_2O_5$, $ZrO_2$, or $Nb_2O_5$. The light guide layer 23 can be formed by film deposition after, for example, mask formation by photolithography.

The length (specifically, the length in the resonance direction RD) and the width (specifically, the width in the direction perpendicular to the resonance direction RD) of the light guide layer 23 can be determined according to the length and width of the ridge portion 20 and the length, in the resonance direction RD, of the second area AR2 where the light guide layer 23 is disposed (the length of the first area AR1 when disposed in the first area AR 1). The light guide layer 23 may be disposed so as to entirely or partially cover the length of the second area AR2 (or the first area A1). This embodiment is described by referring to the configuration where the plane of the light guide layer 23 is rectangular (the shape when viewed from the direction perpendicular to the multilayer body SL) (FIG. 2). However, the embodiment is not limited to the foregoing configuration. For example, the light guide layer 23 may have a trapezoidal shape whose width increases or decreases in the direction toward the second end surface S2 (or the first end surface 1).

Figure 3A:
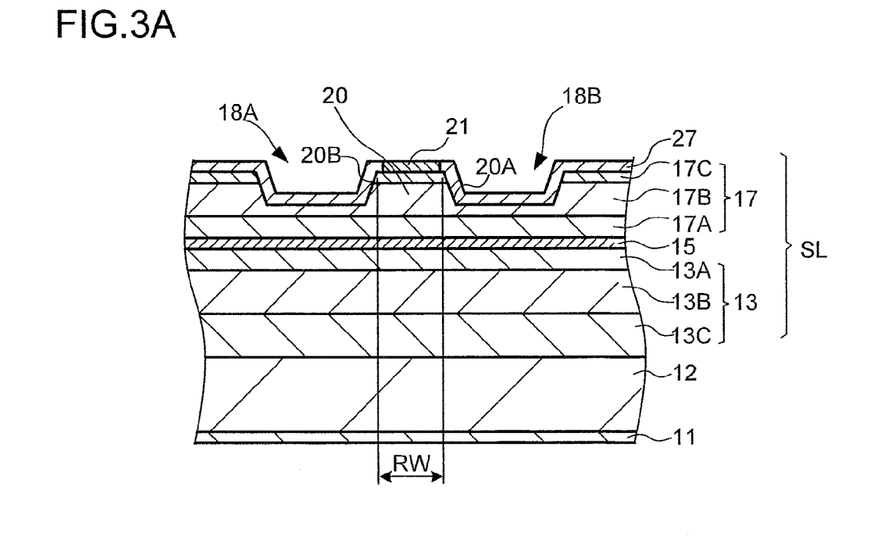
FIG. 3A is a cross-sectional view taken along an A-A' line of FIG. 2.

FIG. 3A is a cross-sectional view taken along an A-A' line of FIG. 2. The A-A' line passes the pair of recesses 18 and the ridge portion 20 and is parallel to the first end surface S1 and the second end surface S2 of the semiconductor light-emitting element 10.

The n-type semiconductor layer 13 includes, for example, an n-GaN buffer layer 13C, an n-GaN clad layer 13B, and an n-InGaN clad layer 13A. The buffer layer 13C and the clad layer 13B are n-GaN layers doped with, for example, Si. The clad layer 13A is an n-InGaN layer doped with, for example, Si. The configuration where the n-type semiconductor layer 13 as the first semiconductor layer consists of a plurality of semiconductor layers is described. However, the n-type semiconductor layer 13 needs to be formed of at least one semiconductor layer.

The light emitting layer 15 has a structure of Multiple Quantum Well (MQW) including, for example, a plurality of barrier layers and a plurality of quantum well layers. The barrier layer of the quantum well structure is made of, for example, GaN. The quantum well layer is made of, for example, InGaN.

The p-type semiconductor layer 17 includes, for example, a p-InGaN clad layer 17A, a p-GaN clad layer 17B, and a p-GaN contact layer 17C. The clad layer 17A is a p-InGaN layer doped with, for example, Mg. The clad layer 17B and the contact layer 17C are p-GaN layers doped with, for example, Mg. The configuration where the p-type semiconductor layer 17 as the second semiconductor layer consists of a plurality of semiconductor layers is described. However, the p-type semiconductor layer 17 needs to be formed of at least one semiconductor layer.

It is preferable that the depth of the pair of recesses 18 be set so that the pair of recesses 18 do not extend to the light emitting layer 15. In other words, it is preferable that the p-type semiconductor layer 17 is formed to exist between the bottom section of the pair of recesses 18 and the light emitting layer 15. The pair of recesses 18 can be formed on the p-type semiconductor layer 17 as a pair of recesses with the same depth, width, length, and shape by means of, for example, dry etching, such as reactive ion etching, or wet etching.

An insulation layer 27 is formed on the p-type semiconductor layer 17, except for the contact area where the band-shaped electrode 21 is formed. More specifically, the insulation layer 27 is formed on the p-GaN contact layer 17C except the contact area and the entire area of the recess 18A and the recess 18B (specifically, on the bottom surfaces and side walls of the recess 18A and the recess 18B). The insulation layer 27 is, for example, SiO$_2$. On the top section of the ridge portion 20, a band-shaped opening is formed on the insulation layer 27, and the band-shaped electrode 21 is formed as a p-type electrode connected to the p-type contact layer 17C that is exposed in the opening. A pad electrode (not shown) electrically connected to the band-shaped electrode 21 is disposed on the insulation layer 27.

Figure 3B:
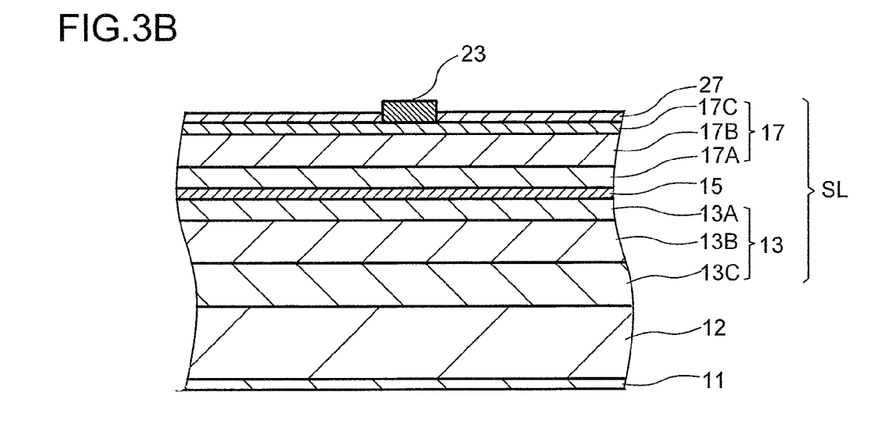
FIG. 3B is a cross-sectional view taken along a B-B' line of FIG. 2.

FIG. 3B is a cross-sectional view taken along a B-B' line of FIG. 2. The B-B' line does not pass the pair of recesses 18 and the ridge portion 20 and is parallel to the second end surface S2 of the semiconductor light-emitting element 10.

With reference to FIG. 3B and FIG. 2, the light guide layer 23 is located at a position where the light guide layer 23 is symmetrical about the center line CL in the direction where the band-shaped electrode 21 extends in the second area AR2. The light guide layer 23 is formed so that the width thereof is smaller than the width of the ridge portion 20, for example, a width RW of the top section of the ridge portion 20. It is preferable that the light guide layer 23 be symmetrical about the center line CL. More specifically, in the second area AR2, the light guide layer 23 is formed on the p-GaN contact layer 17C, and the insulation layer 27 is formed in the area of the p-GaN contact layer 17C, except for the area where the light guide layer 23 is formed. The film thickness of the light guide layer 23 is larger than that of the insulation layer 27.

A waveguide by a ridge does not exist in the second area AR2 since a ridge does not exist therein. However, the light guide layer 23 is provided in the second area AR2. The light guide layer 23 provides a refractive index waveguide structure between the ridge portion 20 and the second end surface S2. Accordingly, the light confinement efficiency and the transverse mode controllability thereby increase. The aforementioned structure provides improved transverse-mode controllability than a structure without the light guide layer 23. In other words, the light guide layer 23 provides a waveguide structure whereby radiation light is guided from the light emitting layer 15 even in an area where a ridge is not formed (i.e., in the second area AR2).

Figure 4A:
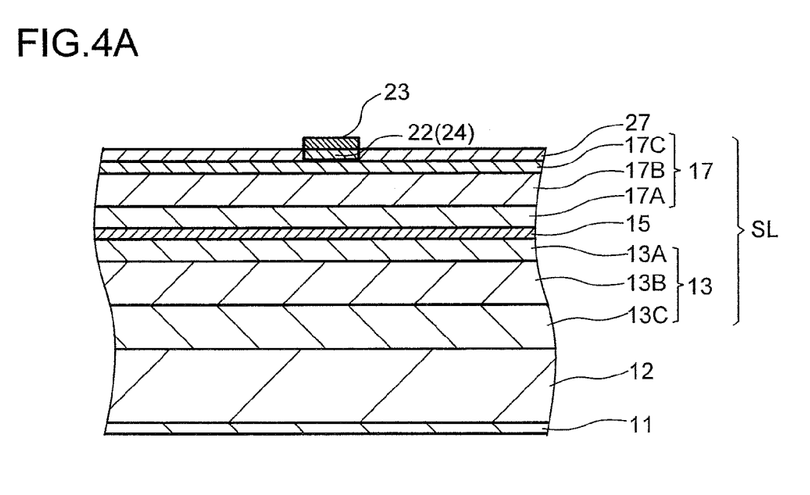
FIGS. 4A and 4B are each a cross-sectional view illustrating a modified example of the semiconductor light emitting element of FIG. 3B.

The embodiment has been described with referring to the configuration where the end portion 21B of the band-shaped electrode 21 is separated from the light guide layer 23. However, the configuration where an electrode layer is formed as an underlying layer below the light guide layer 23 is possible. For example, FIG. 4A is a cross-sectional view taken along the B-B' line illustrating a modified example of the light-emitting element of FIG. 2. As illustrated in FIG. 4A, the following configuration is possible: the band-shaped electrode 21 extending on the ridge portion 20 is formed of a non-light-transmitting electrode of, for example, a metal; a light-transmitting electrode 22, which is transmissive for radiation light from the light emitting layer 15, is formed on the contact layer 17C separately from the band-shaped electrode 21; and the light guide layer 23 is formed on the light-transmitting electrode 22. In this configuration, it is preferable that the light-transmitting electrode 22 be electrically connected to the band-shaped electrode 21. The entire band-shaped electrode 21 may be configured to be an electrode with transmissivity for radiation light from the light emitting layer 15 (i.e., band-shaped electrode 24), and the light guide layer 23 may be formed thereon.

Figure 4B:
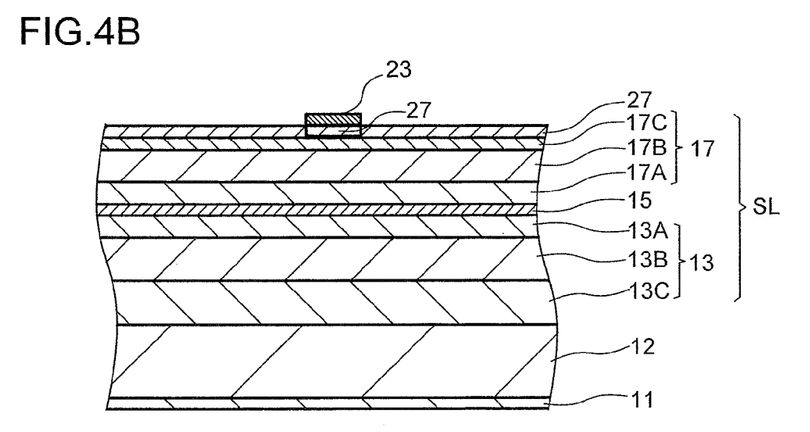

As illustrated in FIG. 3B, it is preferable that in the opening of the insulation layer 27, the light guide layer 23 be formed so as to be in contact with the p-type semiconductor layer 17 (for example, p-GaN contact layer 17C). However, as illustrated in FIG. 4B, the light guide layer 23 may be formed on the insulation layer 27. FIG. 4O is cross-sectional view taken along the B-B' line illustrating a modified example where the light guide layer 23 is formed on the insulation layer 27 of the light-emitting element of FIG. 2.

As the light guide layer 23, it is possible to use a dielectric film of, for example, $SiO_2$, whose refractive index is greater than that of air and smaller than that of a semiconductor layer of, for example, GaN constituting the semiconductor multilayer body SL. Even when the refractive index of the light guide layer 23 is smaller than that of the semiconductor layer constituting the multilayer body SL, the light confinement efficiency of the multilayer body SL containing the light emitting layer 15 can be enhanced by the light guide layer 23.

It is possible to use the light guide layer 23 whose refractive index is greater than that of at least one of the semiconductor layers constituting the semiconductor multilayer body SL. In this case, high light confinement efficiency in the multilayer body SL and high transverse mode controllability can be achieved. For example, the specific refractive index of $Nb_2O_5$ is 2.50, which is greater than those of GaN-based semiconductors. For example, the specific refractive indexes of GaN and AlGaN are 2.47 and 2.23, respectively. Use of the light guide layer 23 made of a high refractive index material, such as $Nb_2O_5$, whose refractive index is greater than or equal to those of the semiconductor layers constituting the multilayer body SL, enables production of a semiconductor laser with higher transverse mode controllability and higher light confinement efficiency.

It is preferable to dispose the light guide layer 23 on the second semiconductor layer (i.e., in the second area AR2) on the end surface side (e.g., second end surface S2) of the semiconductor light-emitting element 10 with a higher reflectance, out of the two end surface sides of the semiconductor light-emitting element 10. In this case, the light confinement and the feedback to the inside of the resonator are greater in the area near the end surface with a higher reflectance. The amplification efficiency is high even when a ridge-free area (second area AR2) is disposed on the end surface portion. A semiconductor laser with high light intensity can be produced without increasing the threshold current.

Figure 5:
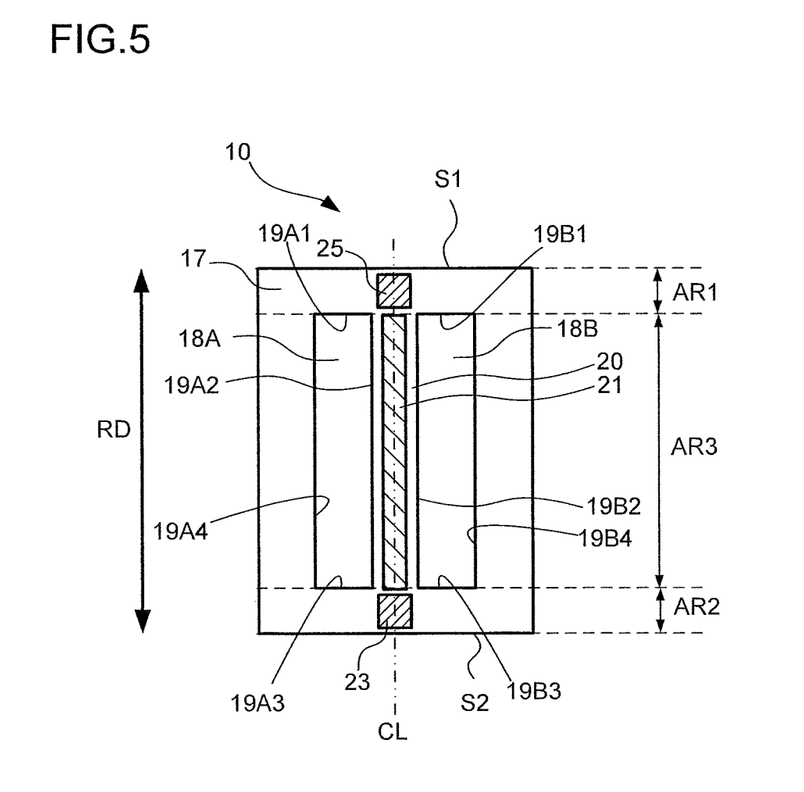
FIG. 5 is a top view schematically illustrating a modified example of the semiconductor light-emitting element according to the first embodiment.

This embodiment has been described with reference to the configuration where the light guide layer 23 is disposed only in the second area AR2 on the end surface side with a higher reflectance (i.e., second end surface S2). However, the embodiment is not limited to the aforementioned configuration. As illustrated in FIG. 5, a sub light guide layer 25 may be disposed in the first area AR1 on the side of the first end surface S1. When the sub light guide layer 25 is disposed in the first area AR1 on the side of the first end surface S1, which is a light-emission or light-extracting surface, the light confinement efficiency in the transversal direction increases, and multi-mode oscillation can be prevented. Also, the shape of the near field pattern (NFP) and the far field pattern (FFP) is stabilized. Specifically, a stable transverse mode shape can be achieved, and the light condensation by a lens, etc. can be enhanced.

Figure 6A:
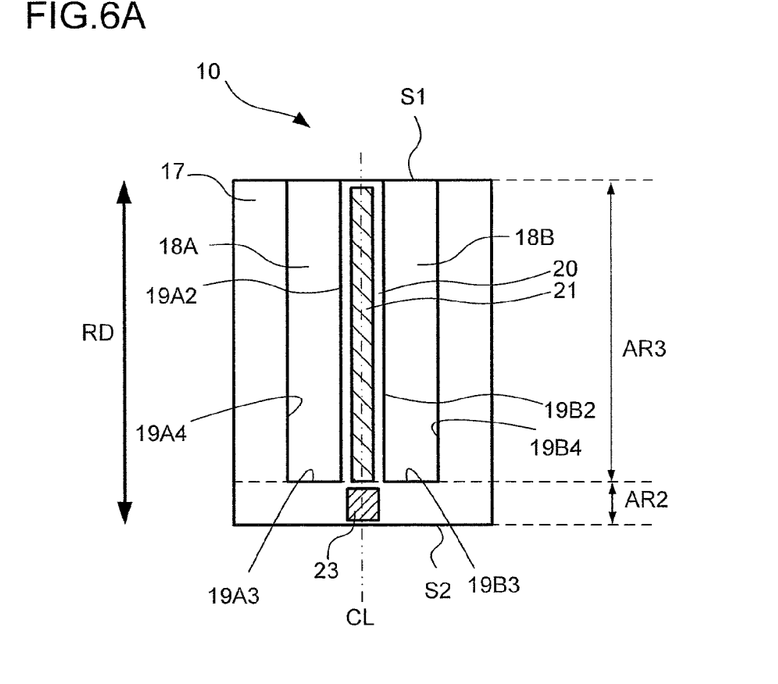
FIGS. 6A and 6B are each a top view illustrating the modified example of the semiconductor light-emitting element according to the first embodiment.

The embodiment has been described with reference the configuration where the pair of recesses 18 are separated from the first end surface S1 and the second end surface S2 at a distance. However, separation from the first end surface S1 is not necessary. In other words, as illustrated in FIG. 6A, the bottom sections of the pair of recesses 18 may extend to the first end surface S1.

Figure 6B:
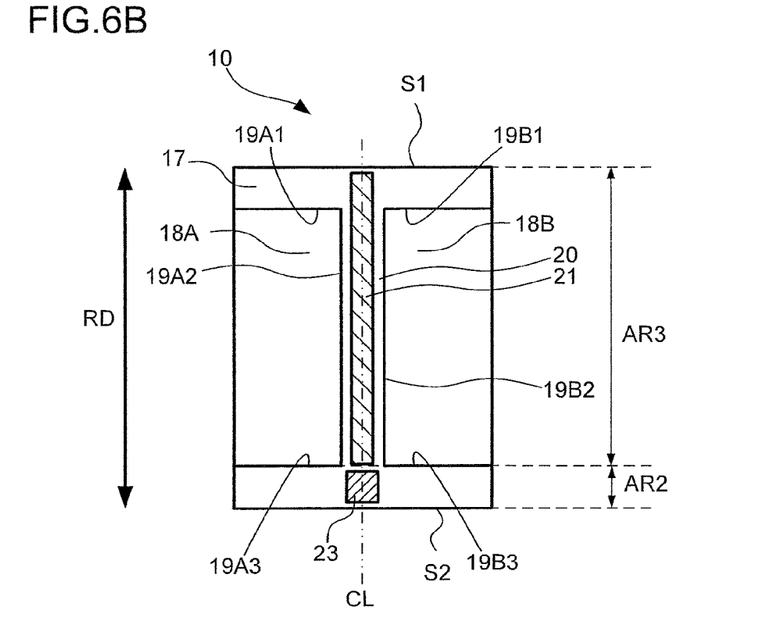

As described above, the ridge portion 20 is formed by the recesses 18A, 18B. As illustrated in FIG. 6B, the recesses 18A, 18B may each have a width that extends to the side surfaces of the multilayer body SL in the direction perpendicular to the resonance direction RD (i.e., a width in the direction perpendicular to the resonance direction RD) on the second semiconductor layer 17.

The embodiment has been described with reference to the configuration where the first end surface S1 and the second end surface S2 have the reflective films 28, 29, respectively, and the first end surface S1 is higher than the second end surface S2 in terms of the reflectance with respect to radiation light from the light emitting layer 15. However, this embodiment may be modified so that the first end surface S1 and the second end surface S2 have the same reflectance. According to another modified example, the first end surface S1 may be a cleaved surface and may not have to have the reflective film 28.

Second Embodiment

Figure 7A:
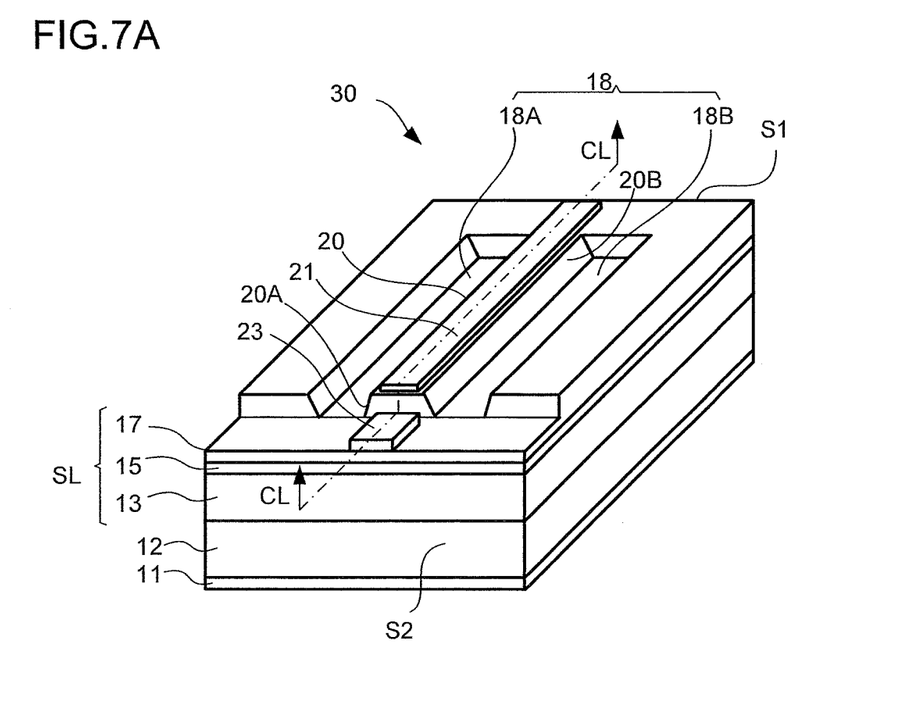
FIG. 7A is a perspective view schematically illustrating a semiconductor light-emitting element according to a second embodiment.
Figure 7B:
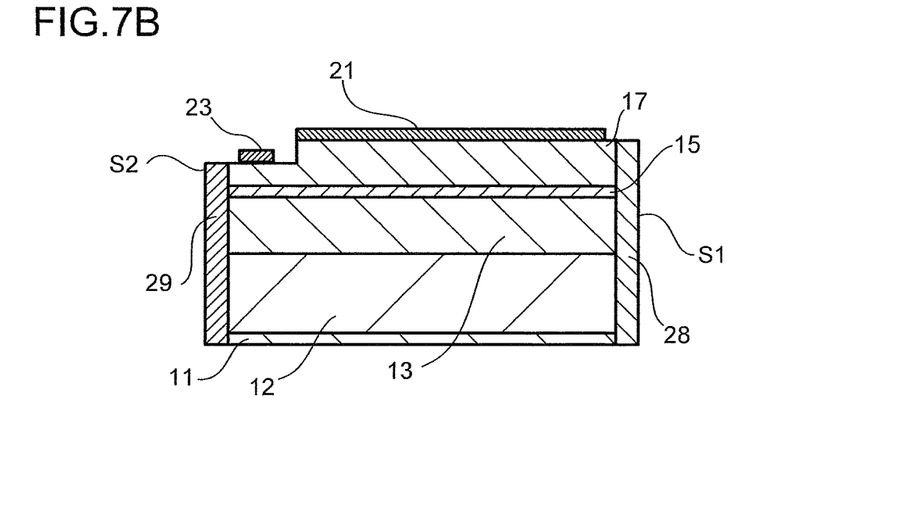
FIG. 7S is a cross-sectional view taken along a CL-CL line of FIG. 7A.
Figure 8:
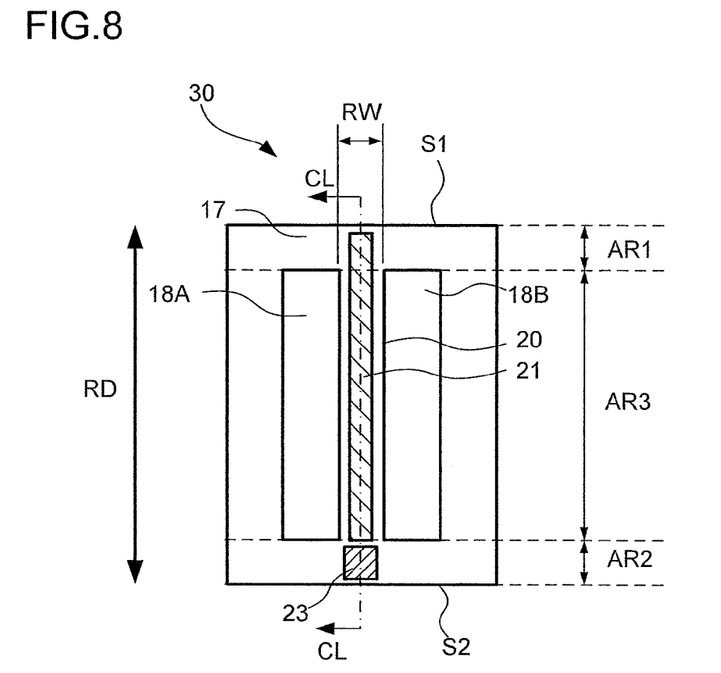
FIG. 8 is a top view schematically illustrating the semiconductor light-emitting element according to the second embodiment.

FIG. 7A is a perspective view schematically illustrating a semiconductor light-emitting element 30 according to a second embodiment. FIG. 7B is a cross-sectional view taken along the CL-CL line of FIG. 7A. FIG. 8 is a top view schematically illustrating the semiconductor light-emitting element 30 according to the second embodiment. The basic elements of the semiconductor light-emitting element 30, such as the semiconductor multilayer body SL, the pair of recesses 18, the ridge portion 20, and the light guide layer 23, are the same as the corresponding basic elements of the semiconductor light-emitting element 10 according to the first embodiment. The semiconductor light-emitting element 30 is different from the semiconductor light-emitting element 10 according to the first embodiment in that the p-type semiconductor layer 17 in the second area AR2 has a smaller thickness than that of the other portions and that the light guide layer 23 is formed on the p-type semiconductor layer 17. As in the case of the first embodiment, the reflective films 28, 29 of the first end surface S1 and the second end surface S2, respectively, are illustrated only in FIG. 7B, and these elements are omitted in the other drawings illustrating this embodiment.

Figure 9:
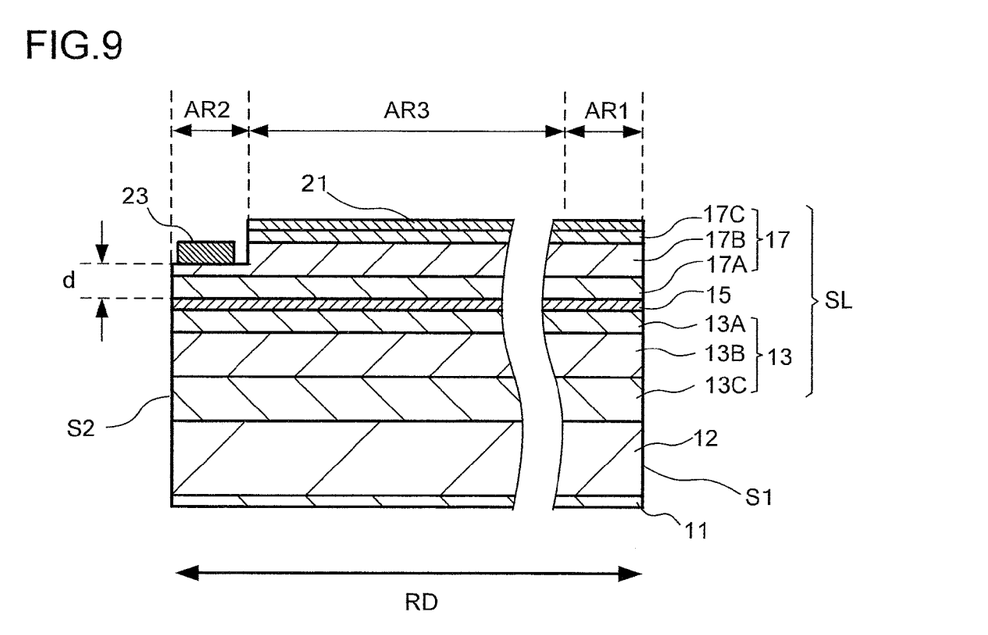
FIG. 9 is a cross-sectional view taken along a CL-CL line of FIG. 8.

FIG. 9 is a cross-sectional view taken along the center line CL-CL of the ridge portion 20 in FIG. 8. The p-type semiconductor layer 17 in the second area AR2 has a smaller thickness than that of the other sections. It is preferable that a layer thickness "d" of the p-type semiconductor layer 17 in the second area AR2 is greater than the layer thickness of the p-type semiconductor layer 17 in the bottom sections of the recess 18A and the recess 18B.

In the semiconductor light-emitting element 30, as the layer thickness "d" of the p-type semiconductor layer 17 in the second area AR2 decreases, the absorption of light from the light emitting layer 15 by the p-type semiconductor layer 17 decreases, and the amount of light that reaches the light guide layer 23 increases. The intensity of the guided wave from the light guide layer 23 increases, and the effect of light confinement in the transversal direction is more noticeable. Also, the sub light guide layer 25 may be disposed in the first area AR1. Even in such a case, the sub light guide layer 25 may be disposed on the p-type semiconductor layer 17 having a reduced layer thickness "d" in the first area AR1 so that the transverse mode is stabilized.

According to the embodiment, the thickness of the area of the p-type semiconductor layer where the light guide layer 23 is disposed is made smaller than that of the other areas. Thereby, the distance between the light guide layer and the light emitting layer can be reduced, and the effect of increasing light confinement in the transversal direction in the light guide layer can be noticeably exerted.

This embodiment has been described with reference to the configuration where in the entire second area AR2 (that is, the entire area in the width direction of the semiconductor laser element), the layer thickness "d" of the p-type semiconductor layer 17 is smaller than the layer thickness of the other areas. However, the embodiment is not limited to the foregoing configuration. The layer thickness "d" of a certain section of the p-type semiconductor layer 17 in the second area AR2 may be smaller in only the width where a crack produced by cleaving in the second area AR2 does not affect the light emitting portion.

Third Embodiment

Figure 10A:
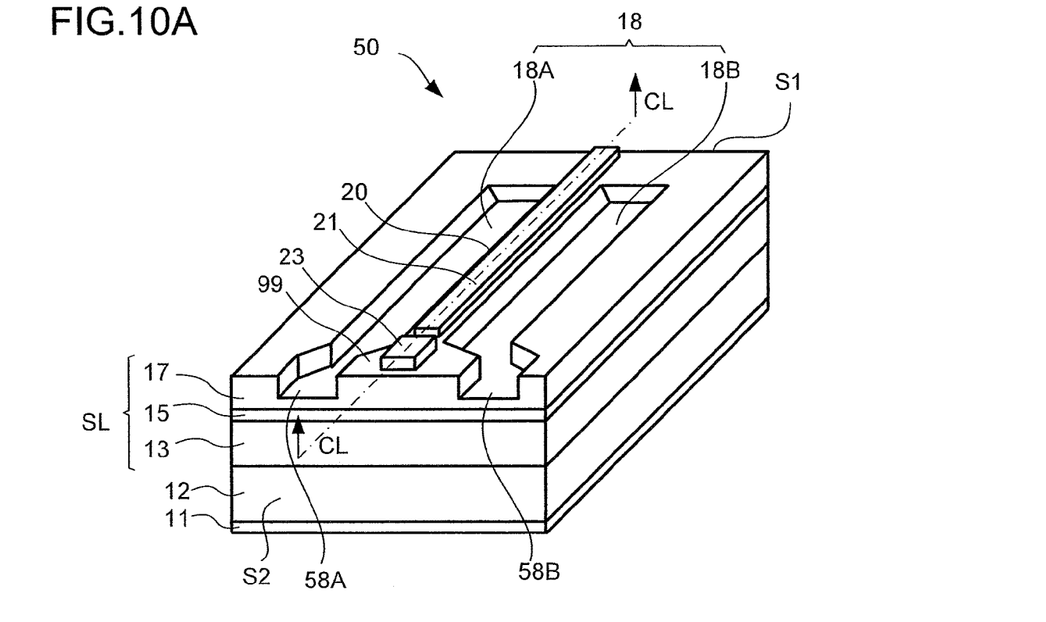
FIG. 10A is a perspective view schematically illustrating a semiconductor light-emitting element according to a third embodiment.
Figure 10B:
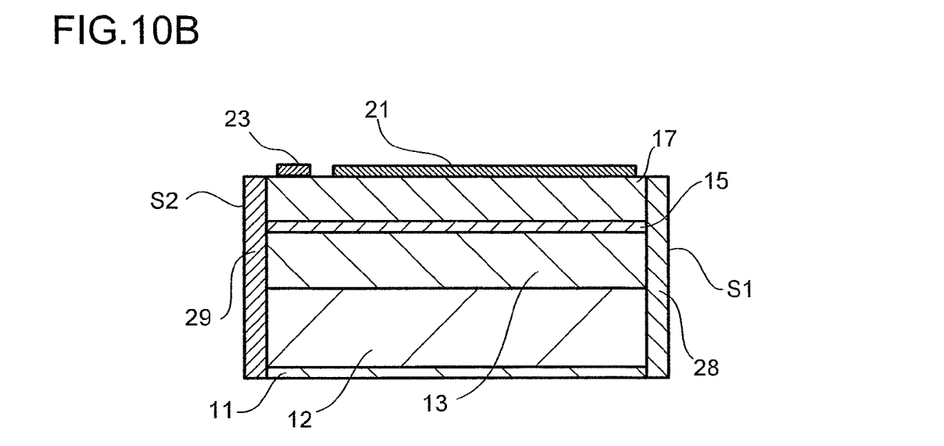
FIG. 10B is a cross-sectional view taken along a CL-CL line of FIG. 10A.
Figure 11A:
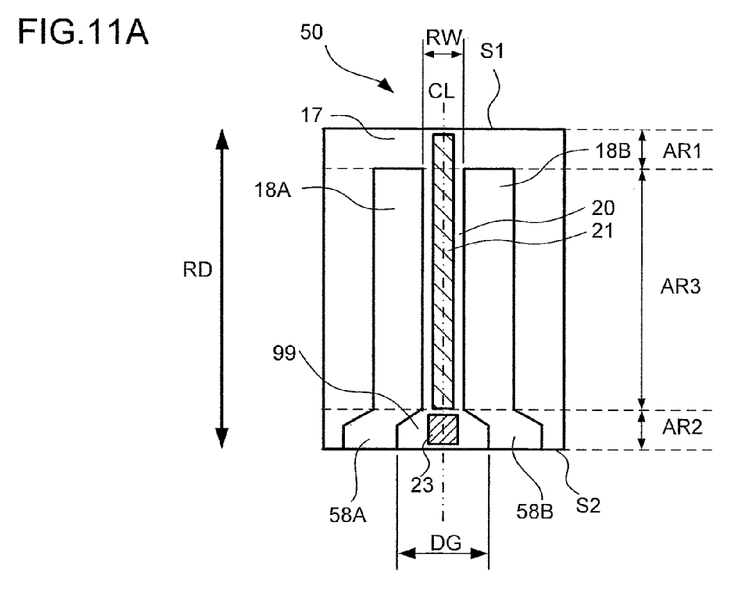
FIG. 11A is a top view schematically illustrating the semiconductor light-emitting element according to the third embodiment.

FIG. 10A is a perspective view schematically illustrating a semiconductor light-emitting element 50 according to a third embodiment. FIG. 10B is a cross-sectional view taken along the CL-CL line of FIG. 10A. FIG. 11A is a top view schematically illustrating the semiconductor light-emitting element 50 according to the third embodiment. The basic elements of the semiconductor light-emitting element 50, such as the semiconductor multilayer body SL, the pair of recesses 18, the ridge portion 20, and the light guide layer 23, are the same as the corresponding basic elements of the semiconductor light-emitting element 10 according to the first embodiment. The difference is that a pair of grooves 58, i.e., a groove 58A and a groove 58B, are formed on the p-type semiconductor layer 17 on the side of the second end surface S2. As in the case of the first embodiment, the reflective films 28, 29 of the first end surface S1 and the second end surface S2, respectively, are illustrated only in FIG. 10B, and these elements are omitted in the other drawings illustrating this embodiment.

The groove 58A and the groove 58B are in communication with the recess 18A and the recess 18B, respectively, and formed so as to extend to the second end surface S2. The bottom surfaces of the pair of grooves 58 are formed so as to extend (i.e., the depth is made constant) from the bottom surfaces of the pair of recesses 18. The bottom surfaces of the pair of recesses 18 and the bottom surfaces of the pair of grooves 58 form an identical plane. The groove 58A and the groove 58B can be formed by, for example, dry etching or wet etching.

The groove 58A and the groove 58B are positioned so as to be symmetrical with respect to the center line CL of the ridge portion 20 in the second area AR2. Also, the groove 58A and the groove 58B are formed so as to be separated so that the distance therebetween is greater than the distance between the recess 18A and the recess 18B. The area between the groove 58A and the groove 58B (i.e., protrusion) is formed as an extended ridge portion 99 connected with the ridge portion 20. The extended ridge portion 99 is connected with the ridge portion 20, has a cross-sectional shape symmetrical about the center line CL (i.e., symmetrical about the plane including the center line CL) of the ridge portion 20, and has a wider width than that of the ridge portion 20.

The groove 58A and the groove 58B extend to the second end surface S2, and thus, there is a possibility that the aforementioned configuration causes occurrence of a crack when cleaving is performed to produce the semiconductor light-emitting element. However, a crack can be prevented from being propagated to the light emitting area of the light emitting layer 15 by properly determining the distance between the groove 58A and the groove 58B, i.e., a width DG of the extended ridge portion 99.

The width DG of the extended ridge portion 99 is greater than the width RW of the ridge portion 20, and the second area AR2 is less effective than the ridge portion 20 in terms of light confinement. However, the light confinement effect is greater when the extended ridge portion 99 is present than when it is absent. As the light guide layer 23 is formed on the extended ridge portion 99, a refractive index waveguide structure is added, and the light confinement effect increases. Since the extended ridge portion 99 and the light guide layer 23 are included, there can be provided a semiconductor laser element with a high light confinement effect without a crack caused by cleaving.

Figure 11B:
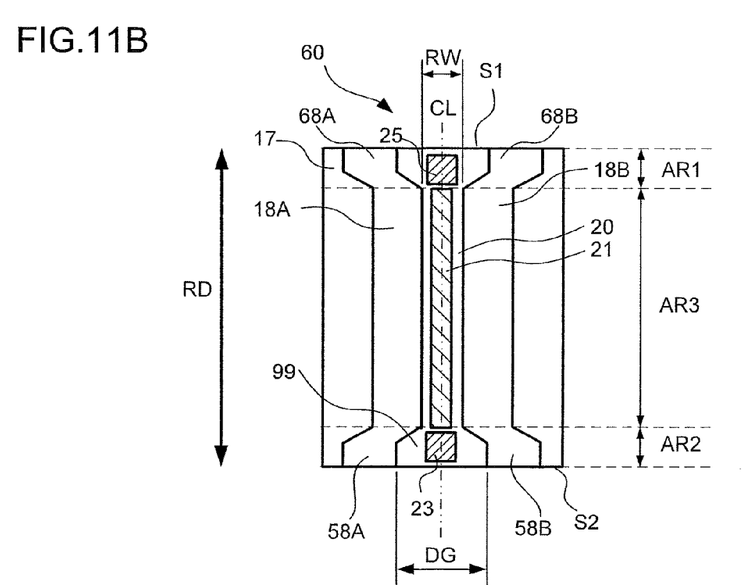
FIG. 11B is a top view schematically illustrating a modified example of the semiconductor light-emitting element according to the third embodiment.

The embodiment has been described, with reference to the configuration where the pair of grooves 58 are added to the second area AR2. However, as illustrated in FIG. 11B, a pair of grooves identical to the groove 58A and the groove 58B, i.e., a groove 68A and a groove 68B, respectively, and a sub light guide layer 25 may further be added to the first area AR1. The transverse mode can be thereby stabilized further.

Figure 12A:
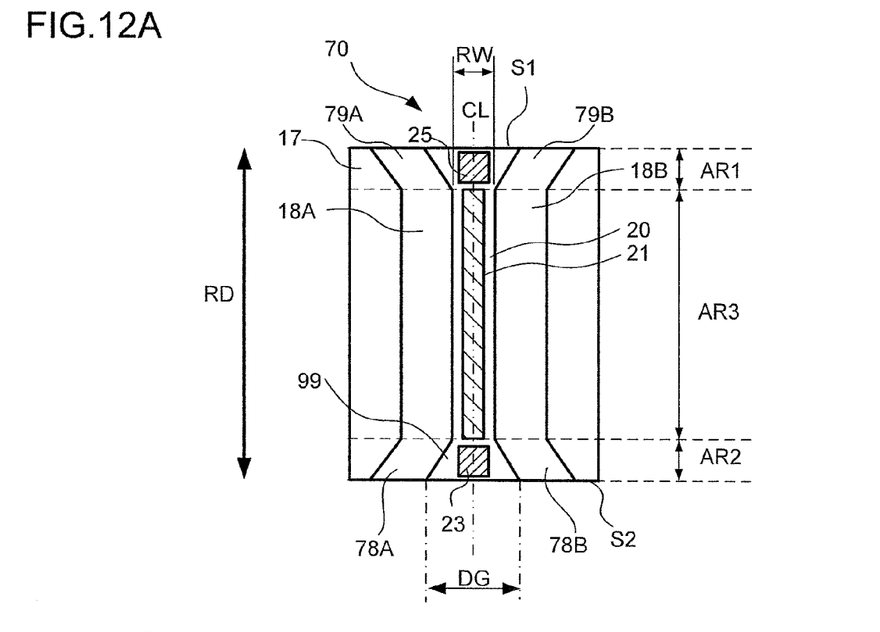
FIGS. 12A and 12B are top views schematically illustrating the modified example of the semiconductor light-emitting element according to the third embodiment.
Figure 12B:
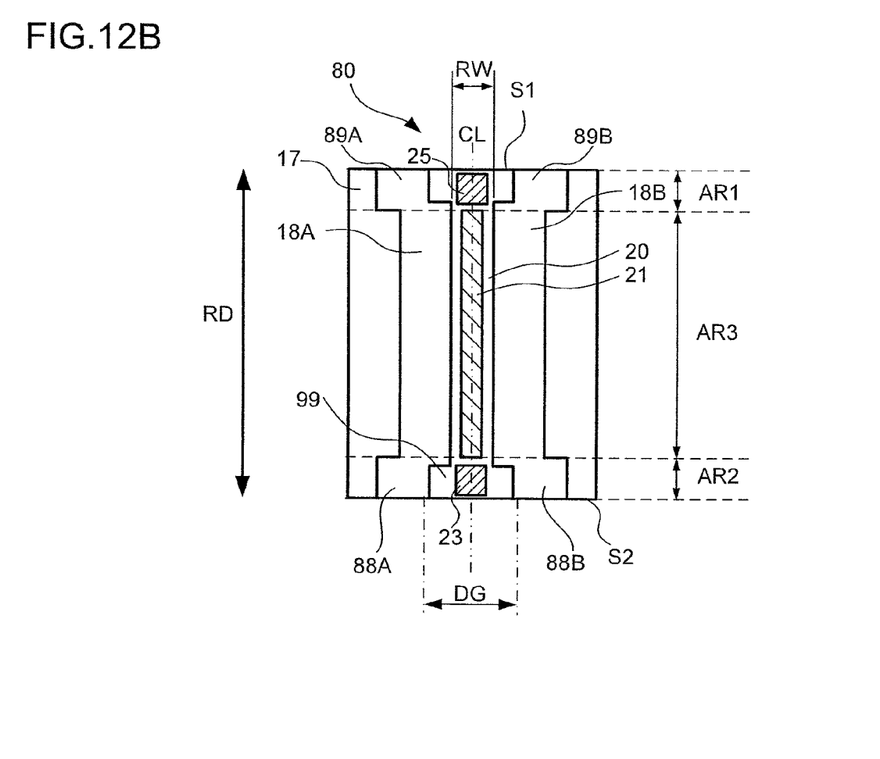

The shapes of the groove 58A and the groove 58B are not limited to the shapes illustrated in FIGS. 10A, 11A and 11B. The groove 58A and the groove 58B may have a different shape. FIGS. 12A and 12B are top views which respectively illustrate the semiconductor light-emitting elements 70 and 80, which are modified examples of the shapes of the groove 58A and the groove 58B. As Illustrated, in FIG. 12A, a groove 78A and a groove 78B may be shaped so as to straightly extend from the second end surface S2 to the pair of recesses 18. As in the case of a groove 88A and a groove 88B illustrated in FIG. 12B, a pair of rectangular grooves may be used. The semiconductor light-emitting elements 70 and 80 are examples where the first area AR1 has the sub light guide layer 25 and a pair of grooves (i.e., 79A and 79B in FIG. 12A, and 89A and 89B in FIG. 12A) identical to those of the second area AR2. The extended ridge portion 99 is formed by the grooves 58A and 58B and the grooves of the modified example. Each groove may extend to the side surface of the multilayer body SL in the direction perpendicular to the resonance direction RD in the first area AR1 and the second area AR2.

The aforementioned embodiments have been described with reference to the configuration where the recess 18A and the recess 18B have the same shape and dimensions (i.e., length, width, and depth). However, the embodiment is not limited to the foregoing configuration. As long as the recess 18A and the recess 18B are aligned in the direction (i.e., resonation direction) perpendicular to the resonator end surface so that a side wall 20A of the recess 18A and a side wall 20B of the recess 18B (i.e., side walls configuring the ridge portion 20) have the same length and are located at the same position in the aforementioned perpendicular direction, the recess 18A and the recess 18B may have shapes and dimensions different from each other. The aforementioned embodiments may be combined. For example, the second area AR2 may have the p-type semiconductor layer 17 whose layer thickness "d" is small as in case of the second embodiment, and the extended ridge portion 99 may be formed in the first area AR1 as in case of the third embodiment.

As described above in detail, according to the present invention, a ridge is disposed so as to be separated from the resonator end surface at a distance in a semiconductor laser of a ridge structure. Also, a light guide layer is disposed on a semiconductor layer between the ridge and the resonator end surface, in other words, on the semiconductor layer in the resonator end or edge area of the semiconductor laser where the ridge is not formed. Performance deterioration due to a cleavage-caused crack can thereby be avoided, and a highly reliable light-emitting element with a high light confinement effect and excellent transverse mode controllability and light emitting characteristics can be provided.

A ridge structure where the ridge width of a resonator end portion of a semiconductor laser is increased is introduced to avoid performance deterioration due to a cleavage-caused crack. As a result, a highly reliable light-emitting element with a high light confinement effect and excellent transverse mode controllability and light emitting characteristics can be provided.

This application is based on a Japanese Patent Application No. 2015-206550 which is hereby incorporated by reference.

What is claimed is:

1. A semiconductor light-emitting element comprising:
    a semiconductor multilayer body having a first end surface and a second end surface which are opposed to each other, wherein a first semiconductor layer, a light emitting layer, and a second semiconductor layer which is an opposite conductivity-type to that of the first semiconductor layer are stacked, in this order, on a substrate;
    a pair of recesses that are provided in the second semiconductor layer, separated from the second end surface, and separated from each other in a direction parallel to the first end surface and the second end surface;
    a ridge portion that is a protrusion between the pair of recesses and extends along a direction perpendicular to the first end surface and the second end surface, the ridge portion being separated from the second end surface;
    a band-shaped electrode disposed on the ridge portion; and
    a light guide layer that is provided on the second semiconductor layer between an end portion of the ridge portion on a second end surface side of the ridge portion and the second end surface, wherein the light guide layer guides radiation light from the light emitting layer.

2. The semiconductor light-emitting element according to claim 1, wherein:
    the pair of recesses are separated from the first end surface;
    the ridge portion is separated from the first end surface; and
    the light guide layer includes a sub light guide layer provided between an end portion of the ridge portion on a first end surface side of the ridge portion and the first end surface on the second semiconductor layer.

3. The semiconductor light-emitting element according to claim 1, wherein the pair of recesses are aligned with each other in the perpendicular direction, and side walls of the pair of recesses forming the ridge portion have a same length in the perpendicular direction.

4. The semiconductor light-emitting element according claim 1, wherein the light guide layer is disposed so as to be aligned with the band-shaped electrode in the direction in which the ridge portion extends.

5. The semiconductor light-emitting element according to claim 1, wherein the light guide layer has a width that is smaller than or equal to a width of the ridge portion in a direction perpendicular to the direction in which the ridge portion extends.

6. The semiconductor light-emitting element according to claim 1, wherein the second end surface has a higher reflectance than the first end surface with respect to the radiation light.

7. The semiconductor light-emitting element according to claim 1, wherein:
    the pair of recesses are separated from the first end surface; and
    the band-shaped electrode extends on the second semiconductor layer between the ridge portion and the first end surface.

8. The semiconductor light-emitting element according to claim 1, comprising a transparent electrode layer that is provided between the second semiconductor layer and the light guide layer and is electrically connected to the band-shaped electrode.

9. The semiconductor light-emitting element according to claim 1, wherein the band-shaped electrode comprises a transparent electrode layer and extends on the second semiconductor layer between the ridge portion and the second end surface.

10. The semiconductor light-emitting element according claim 1, wherein the light guide layer comprises a dielectric body.

11. The semiconductor light-emitting element according to claim 1, wherein the second semiconductor layer comprises at least one semiconductor layer, and a refractive index of the light guide layer is greater than a refractive index of any one of the at least one semiconductor layer.

12. The semiconductor light-emitting element according to claim 11, wherein the guide layer includes a layer comprising $Nb_2O_5$.

13. The semiconductor light-emitting element according to claim 1, wherein a layer thickness of the second semiconductor layer between the ridge portion and the second end surface is smaller than a layer thickness of the second semiconductor layer in the ridge portion.

14. The semiconductor light-emitting element according to claim 13, wherein the layer thickness of the second semiconductor layer between the ridge portion and the second end surface is greater than a layer thickness of the second semiconductor layer in the pair of recesses.

15. The semiconductor light-emitting element according to claim 1, further comprising:
    a pair of grooves that are in communication with the pair of recesses and extend to the second end surface, the pair of grooves being separated from each other with a distance between the pair of grooves being greater than a distance between the pair of recesses; and
    an extended ridge portion that is a protrusion between the pair of grooves and is connected with the ridge portion, a width of the extended ridge portion being greater than a width of the ridge portion.

16. The semiconductor light-emitting element according to claim 1, further comprising:
    a pair of grooves that are in communication with the pair of recesses, the pair of recesses being separated from the first end surface, the pair of grooves extending to the first end surface, and the pair of grooves being separated from each other with a distance being between the pair of grooves greater than a distance between the pair of recesses; and
    an extended ridge portion that is a protrusion between the pair of grooves and is connected with the ridge portion, a width of the extended ridge portion being greater than a width of the ridge portion, wherein the light guide layer includes a sub light guide layer provided on the second semiconductor layer between an end portion of the ridge portion on a first end surface side of the ridge portion and the first end surface.

17. The semiconductor light-emitting element according to claim 15, wherein bottom surfaces of the pair of grooves extend from bottom surfaces of the pair of recesses.

* * * * *